(12) United States Patent
Bryan et al.

(10) Patent No.: US 9,654,090 B2
(45) Date of Patent: May 16, 2017

(54) SYSTEMS AND METHODS FOR CLOCK DISTRIBUTION IN A DIE-TO-DIE INTERFACE

(71) Applicant: QUALCOMM Incorporated, San Diego, CA (US)

(72) Inventors: Thomas Clark Bryan, San Diego, CA (US); Alvin Leng Sun Loke, San Diego, CA (US); Stephen Knol, San Diego, CA (US); Gregory Francis Lynch, San Diego, CA (US); Tin Tin Wee, San Diego, CA (US); LuVerne Ray Peterson, San Diego, CA (US); Yue Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/138,142

(22) Filed: Apr. 25, 2016

(65) Prior Publication Data
US 2016/0308519 A1    Oct. 20, 2016

Related U.S. Application Data

(62) Division of application No. 14/335,681, filed on Jul. 18, 2014, now Pat. No. 9,350,339.

(51) Int. Cl.
*H03K 3/00* (2006.01)
*H03K 5/15* (2006.01)
(Continued)

(52) U.S. Cl.
CPC ........... *H03K 5/15013* (2013.01); *G06F 1/10* (2013.01); *G11C 7/22* (2013.01); *H01L 23/5384* (2013.01); *H01L 25/0655* (2013.01); *H01L 23/5389* (2013.01); *H01L 2224/04105* (2013.01); *H01L 2224/12105* (2013.01); *H01L 2224/16225* (2013.01); *H01L 2224/16227* (2013.01); *H01L 2224/16235* (2013.01);
(Continued)

(58) Field of Classification Search
CPC .................................................. H03K 5/15013
See application file for complete search history.

(56) References Cited

U.S. PATENT DOCUMENTS 5,686,845 A    11/1997 Erdal et al.
6,204,713 B1    3/2001 Adams et al.
(Continued)

OTHER PUBLICATIONS

International Search Report and Written Opinion—PCT/US2015/032458—ISA/EPO—Aug. 28, 2015.
(Continued)

*Primary Examiner* — Daniel Puentes
(74) *Attorney, Agent, or Firm* — Chui-Kiu Teresa Wong; Kenneth Vu

(57) ABSTRACT

Circuits for die-to-die clock distribution are provided. A system includes a transmit clock tree on a first die and a receive clock tree on a second die. The transmit clock tree and the receive clock tree are the same, or very nearly the same, so that the insertion delay for a given bit on the transmit clock tree is the same as an insertion delay for a bit corresponding to the given bit on the receive clock tree. While there may be clock skew from bit-to-bit within the same clock tree, corresponding bits on the different die experience the same clock insertion delays.

17 Claims, 7 Drawing Sheets

(51) Int. Cl.
*H01L 23/538* (2006.01)
*G06F 1/10* (2006.01)
*G11C 7/22* (2006.01)
*H01L 25/065* (2006.01)

(52) U.S. Cl.
CPC *H01L 2224/20* (2013.01); *H01L 2224/24137* (2013.01); *H01L 2224/73267* (2013.01); *H01L 2924/15311* (2013.01)

(56) References Cited

U.S. PATENT DOCUMENTS

| | | |
|---|---|---|
| 6,711,716 B1 | 3/2004 | Mueller et al. |
| 6,737,903 B2 | 5/2004 | Suzuki |
| 7,145,362 B1 | 12/2006 | Bergendahl et al. |
| 7,405,108 B2 | 7/2008 | Burrell et al. |
| 2002/0031016 A1 | 3/2002 | Sato et al. |
| 2008/0263488 A1* | 10/2008 | Banerji .............. G06F 17/505 716/113 |
| 2010/0289064 A1 | 11/2010 | Or-Bach et al. |
| 2012/0032326 A1 | 2/2012 | Kim et al. |
| 2012/0114087 A1 | 5/2012 | Dimitriu et al. |
| 2016/0020759 A1 | 1/2016 | Bryan et al. |

OTHER PUBLICATIONS

Liu C.C., et al., "High Performance Integrated Fan-Out Wafer Level Packaging (InFO-WLP): Technology and System Integration," 978-1-4673-4871-3/12 © 2012, IEEE, pp. IEDM12-323 to IEDM12-326.

* cited by examiner

SYSTEMS AND METHODS FOR CLOCK DISTRIBUTION IN A DIE-TO-DIE INTERFACE

CROSS REFERENCE TO RELATED APPLICATIONS

This application is a divisional of U.S. application Ser. No. 14/335,681, filed Jul. 18, 2014.

TECHNICAL FIELD

This application relates to clock distribution, and more particularly, to clock distribution in a die-to-die interface using unbalanced clock trees.

BACKGROUND

Packaged systems incorporating multiple die are receiving growing interest. Multi-die packages use die-to-die links to enable communication between die. A die-to-die link must typically support very large aggregate data bandwidth and favors a parallel bus architecture with a forwarded clock for simpler data retiming at the receiver.

One conventional technique to provide die-to-die clock distribution is to employ a balanced clock tree on both die. A balanced clock tree is designed such that the distance from an external clock-input contact to a bit is the same from bit to bit within each die. In other words, the clock insertion delay is the same (or very close to the same) for each bit of the die.

An example of a balanced tree is an "H" tree, where the metal routes from the external contact to each of the bits form paths that look like a recursive hierarchy of the letter "H," and the length from a given bit to the external contact is substantially uniform over all of the bits. In an example conventional system each bit corresponds to a flip-flop. The clock tree feeds the group of flip-flops, where each flip-flop either transmits a bit of data or captures a bit of data at a clock edge. When the tree is balanced, the clock insertion delays to each of the bits are uniform, and the flip-flops receive the clock edge at the same time. Such feature may be useful in a die that is intended for use in a multi-die package. In one example, the die has multiple bits that transmit data, and the balanced tree causes the bits to be transmitted at the same time. Such synchronized transmission of bits allows for the die to be paired with another die that expects to receive the bits. Thus, the die can be manufactured with no knowledge at the time as to which dies it will be packaged with, assuming the dies expect synchronized transmission, or reception, of bits.

However, balancing a clock tree may include using longer metal traces for some bits, thereby increasing the total amount of metal, parasitic capacitance to nearby metal, and dynamic power consumption in the clock tree as a whole. There is thus a need in the art for more power-efficient clock distribution in die-to-die clock interfaces.

SUMMARY

Circuits for die-to-die clock distribution are provided. In one example, a multi-die package includes at least two die. One die has an unbalanced clock tree feeding a group of transmit bits. Another die has an unbalanced clock tree feeding a group of receive bits. Each transmit bit on the first die corresponds to a receive bit on the second die. Also, the transmit clock tree forwards the clock signal to the receive clock tree.

In an unbalanced tree, insertion delays vary bit to bit. However, in this embodiment, the insertion delay for a given bit on the receive clock tree matches an insertion delay for its corresponding bit on the transmit clock tree.

Continuing with this embodiment, operation of the circuit includes distributing the clock signal to the bits on the transmit clock tree. A node on the transmit clock tree forwards the clock signal to a node on the receive clock tree, which distributes the clock to the bits on the receive side. Focusing on one pair of bits (a transmit bit and a corresponding receive bit), the clock edge reaches the transmit bit after an insertion delay and causes a flip-flop to transmit data to the receive bit. As the data reaches the corresponding bit on the receive side, so does the clock signal because the forwarded clock signal experiences the same insertion delay at the receive clock tree. The other pairs of bits operate the same way, though insertion delay is different from pair to pair.

Various embodiments provide one or more advantages over conventional solutions. For instance, an unbalanced clock tree may use less metal, thereby reducing overall clock tree capacitance and dynamic power consumption, when compared to a balanced clock tree. These and other advantages may be better appreciated by the detailed description below.

DETAILED DESCRIPTION

Example Circuit Embodiments

Figure 1:
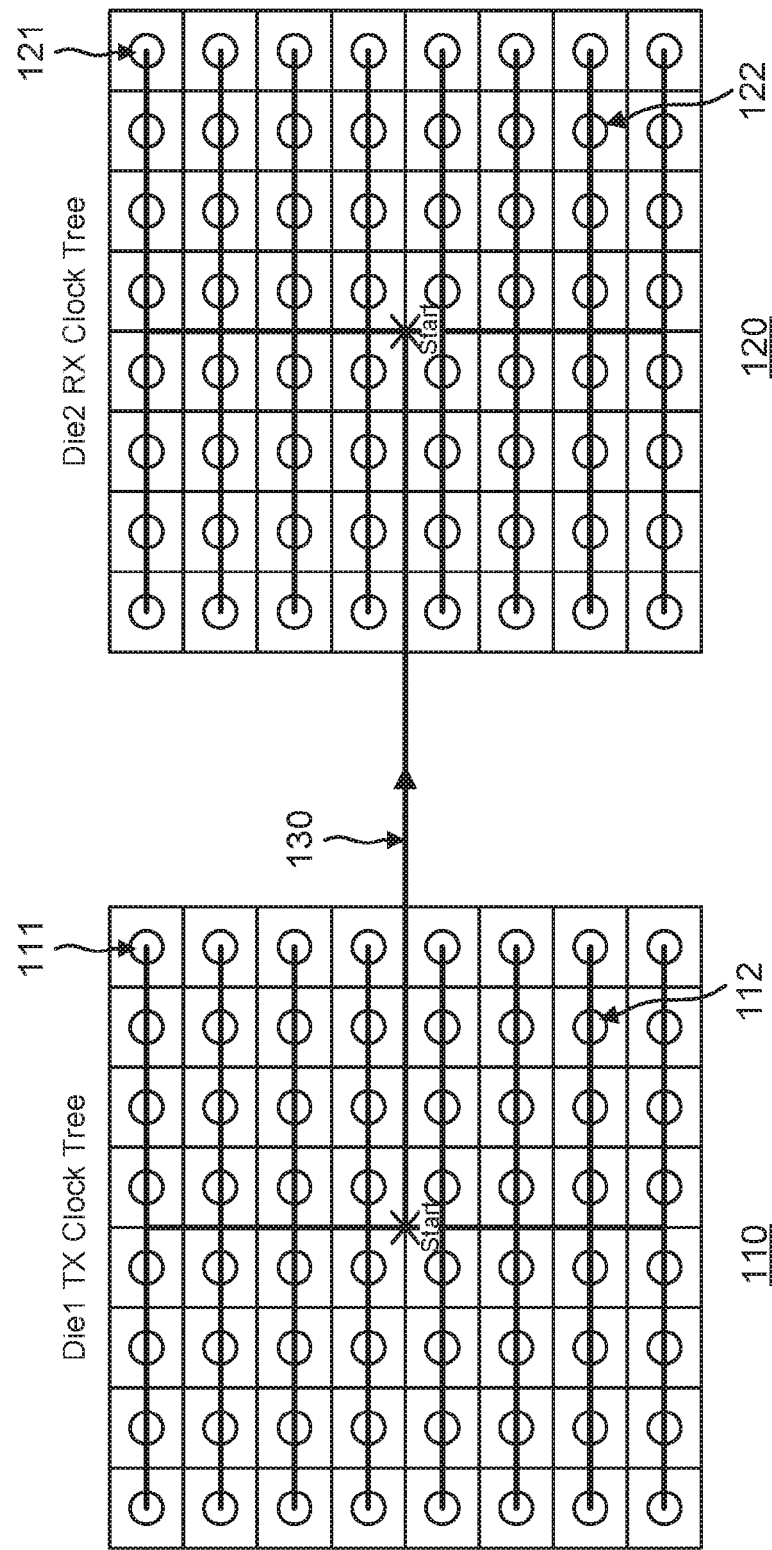
FIG. 1 is an illustration showing a transmit clock tree coupled to a receive clock tree according to one embodiment

In order to reduce metal and capacitance of the clock trees, a proposed design uses unbalanced clock trees at both die. In one example, each clock tree has a plurality of routes, where the routes to the different bits may be different lengths. But the overall design of the tree allows for a significant reduction in the amount of metal in the routes for the clock tree as a whole. FIG. 1 is an illustration showing a transmit clock tree 110 coupled to a receive clock tree 120 according to one embodiment, where the clock is forwarded from die 1 to die 2 by external contacts at each of the die. In FIG. 1, the circles on die 1 and die 2 are representative of contacts that either output or input a bit of data at each bit time. Each of the contacts is on an external surface of its respective die, and in example embodiments the contacts are internal to a larger chip package in which die 1 and die 2 are disposed. For convenience, the circles are referred to as bits in the example of FIG. 1. Each of the circles is located in a square. The squares are part of a conceptual grid and serve to illustrate physical dimensions on external surfaces of die 1 and die 2. As explained in more detail below, the physical location of a given bit on die 1 corresponds to a physical location of a corresponding bit on die 2.

In this example, clock trees 110 and 120 are metal traces or routes that are physically disposed on the dies in the pattern shown in FIG. 1. Focusing on the die 1 TX clock tree 110, note that the length of the metal route from the contact (labeled "start") to the top right-most bit 111 is longer than routes for other bits closer to the "start" contact. Thus, each bit is associated with a specific insertion delay, where the insertion delay correlates with the length of its respective route from the external contact.

A system including this type of clock tree may include a transmit clock tree on a first die and a receive clock tree on a second die. The first and second die are included in a multi-die package (e.g., at FIGS. 4 and 5). The transmit clock tree and the receive clock tree are the same (or very nearly the same) so that the insertion delay for a given bit on the transmit clock tree is the same as an insertion delay for its corresponding bit on the receive clock tree. Thus, while there may be clock skew from bit to bit within the same clock tree, corresponding bits on the different die experience the same clock insertion delays.

Each transmit bit on die 1 corresponds to a receive bit on die 2. In the example above, the right-most top bit 111 corresponds to the right-most top bit 121 on die 120, and those bits experience the same clock insertion delay. The other bits are matched in a similar spatial manner and also experience the same respective insertion delays at die 1 and die 2. For instance, bits 112 and 122 are corresponding bits and experience the same insertion delay, though they may experience a different insertion delay than do bits 111 and 121.

Figure 6:
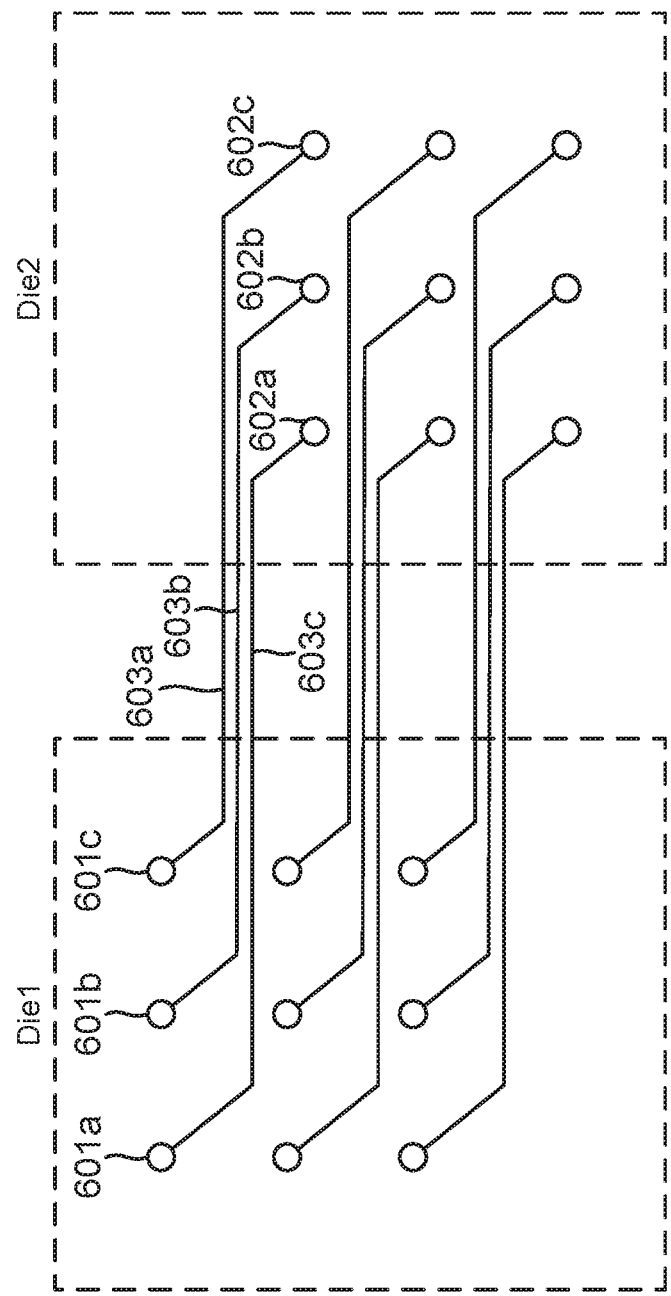
FIG. 6 is an illustration of an example die-to-die interface, adapted according to one embodiment.

FIG. 1 does not show data routes in the package that connect from die 1 to die 2, but the spatial matching of the bits from die to die allows the use of data routes between corresponding bits that are uniform in length. Thus, if there are 64 pairs of corresponding bits, each of the 64 pairs has a same length data route. This is to ensure substantially matched bit-by-bit propagation delays through the package. FIG. 6 shows example data routes. Also, the route 130 that forwards the clock from die 1 to die 2 is the same length as the data routes so that the delay experienced by the data moving from die 1 to die 2 is the same delay experienced by the clock as it is forwarded.

An operating example focusing on bits 111, 112, 121, 122 is instructive. In this example, the clock is received at the contact ("start") at die 1. The clock is then forwarded from die 1 to die 2 as labeled at forwarded clock route 130. The delay due to forwarding the clock is referred to in this example as t1. The clock propagates through the clock tree 110, reaching the bits closest to "start" first and the bits furthest from "start" last, where proximity of a bit to "start" is defined by the metal length rather than the direct point-to-point distance. The insertion delay of the clock to a given bit is proportional to the length of the route to that bit within clock tree 110. In other words, the insertion delay for a given bit is the propagation delay of the clock signal through the clock tree from start of the tree to the bit (e.g., at a flip-flop input of the bit). In this example, the insertion delay experienced by bit 111 is referred to as t2, and the insertion delay experienced by bit 112 is referred to as t3, where t2 is slightly greater than t3 because the metal route to bit 111 is slightly longer than the metal route to bit 112.

When a flip-flop (not shown) at bit 111 receives the rising edge of the clock after insertion delay t2, the flip-flop transmits data to bit 121 over a data route (not shown). The data arrives at bit 121 at a time t2+t1 because the delay experienced by the data as it is forwarded from die to die is the same as the delay experienced by the clock as it is forwarded from die to die.

As mentioned earlier, the clock is forwarded to receive clock tree 120 (on die 2) with a delay of t1. The forwarded clock then propagates through clock tree 120 in the same manner as in clock tree 110. The insertion delays experienced by the bits at clock tree 120 are proportional to the lengths of the metal routes to those respective bits. In this example, the insertion delay (not including the clock forwarding delay) experienced by bit 121 is equal to t2 because the metal length from clock tree 120 start to bit 121 is equal to the metal length from clock tree 110 start to bit 111. In other words, bit 121 receives the rising edge of the clock at a time t2+t1, which means that the rising edge of the clock at t1 coincides with the transmitted data (from bit 111) being available. A flip-flop associated with bit 121 captures the data at the received clock edge.

Various embodiments may provide one or more data retiming techniques at the receiver that affect the times discussed above. One example embodiment retimes a transmitting flip-flop on the clock rising edge and retimes the receiving flip-flop on the falling edge of the same clock cycle, with a full-rate forwarded clock. Another embodiment employs a half-rate clock and inserts an additional half unit interval (UI) or half bit period in the forwarded clock path to ensure that the receive side flip-flop is retimed half a UI after the data transition occurs. This then provides approximately half a UI of setup time for the receiving flip-flop. Yet another approach is to forward the half rate clock and use a clock doubler, e.g., by XORing the half-rate clock and a ½ UI delay, to locally generate a full-rate clock at the receive side. Such a system employs the clock falling edge of the resulting full-rate clock to retime the receiving flip-flop.

Bit 112 receives the clock edge at t3 and its associated flip-flop transmits its data over a data route (not shown) to bit 122. Thus, the data arrives at bit 122 at a time t3+t1. The clock edge arrives at bit 122 at time t3+t1 as well because the insertion delay experienced by bit 122 is substantially the same as the clock insertion delay experienced by bit 112. A flip-flop associated with bit 122 captures the data at the received clock edge. Once again, various embodiments may include other data retiming techniques, such as those mentioned above in the discussion of bits 111/121.

In the example above, the data exchange between bits 111 and 121 happens at a time that is slightly later than the data exchange between bits 112 and 122 because of the respective insertion delays experienced by those bits in clock trees 110, 120. However, the data is still transmitted and captured by each pair of bits and is processed as appropriate. In this example the same is true for each pair of corresponding bits at each of the clock trees 110, 120, although only two pairs 111/121 and 112/122 were discussed in detail for ease of illustration.

As noted above, the trees 110 and 120 are unbalanced. Differences in the lengths of metal clock traces to the individual bits varies bit-to-bit within a clock tree so that insertion delay is non-uniform throughout the clock tree. The scope of embodiment is not limited, however, to examples in which insertion delay for each bit is different from all other bits, as it is apparent within FIG. 1 that some bits at the same die may have the same or similar insertion delays due to their proximities to start being the same or similar.

Clock trees 110 and 120 are substantially the same because the spatial position of a given bit on tree 110 is similar to a position of a bit corresponding to that given bit on tree 120. Also, the length of a metal route from start to a given bit on tree 110 is similar to the length of the metal route from start to the corresponding bit on tree 120. So for a pair of corresponding bits (one on tree 110 and one on tree 120), the insertion delay experienced by one bit matches the insertion delay experienced by the other bit.

Of course, the scope of embodiment is not limited to exact identicality of the trees 110 and 120. In other examples, manufacturing process imperfections and variations may affect the metal routes and also affect the insertion delays in insubstantial ways. Thus, trees 110 and 120 are substantially the same with respect to the metal clock routes to the bits, manufacturing process imperfections and variations notwithstanding. However, by simply minimizing clock insertion delay through reducing metal routing, the overall effective bit-to-bit skew from Die1 to Die2 is reduced.

Figure 2:
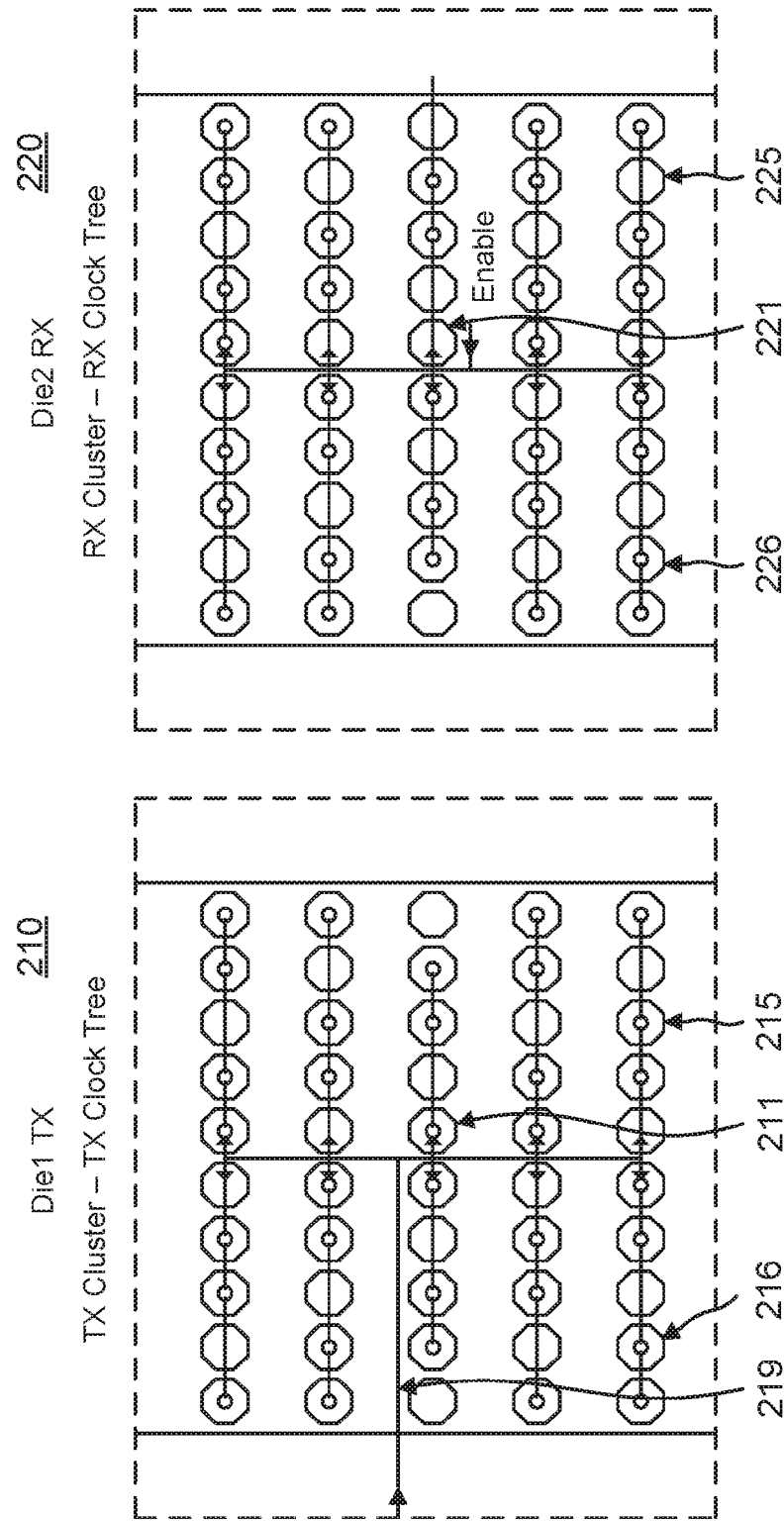
FIG. 2 is an illustration of two dies, each with its own respective clock tree, according to one embodiment.

FIG. 2 is an illustration of two dies 1 and 2, each with its own respective clock tree 210 and 220, according to one embodiment. In FIG. 2, some nodes on the die are clocked for data transfer, whereas other nodes are used for other purposes.

For instance, tree 210 includes a clock-in branch 219 that receives the clock. Tree 210 has node 211, which is a clock node. A clock forwarding route (not shown) is used to send the clock to node 221, where the clock is distributed through tree 220. Other nodes (e.g., nodes 215 and 225) are used for power, such as Vss or Vdd. In FIG. 2, only those nodes that are clocked are marked with a dot in the middle. The nodes marked with a dot (other than nodes 211 and 221) are associated with data bits.

The principles of the FIG. 1 embodiment apply just as well to FIG. 2. For instance, trees 210 and 220 each have a non-uniform insertion delay characteristic, but corresponding TX and RX nodes (e.g., 216 and 226) have matching insertion delays because their respective intra-tree clock routes are substantially the same.

The example clock trees of FIGS. 1 and 2 include less metal length than does a conventional "H" clock tree. Less metal provides for less capacitance and, thus, less dynamic power dissipation.

Figure 3:
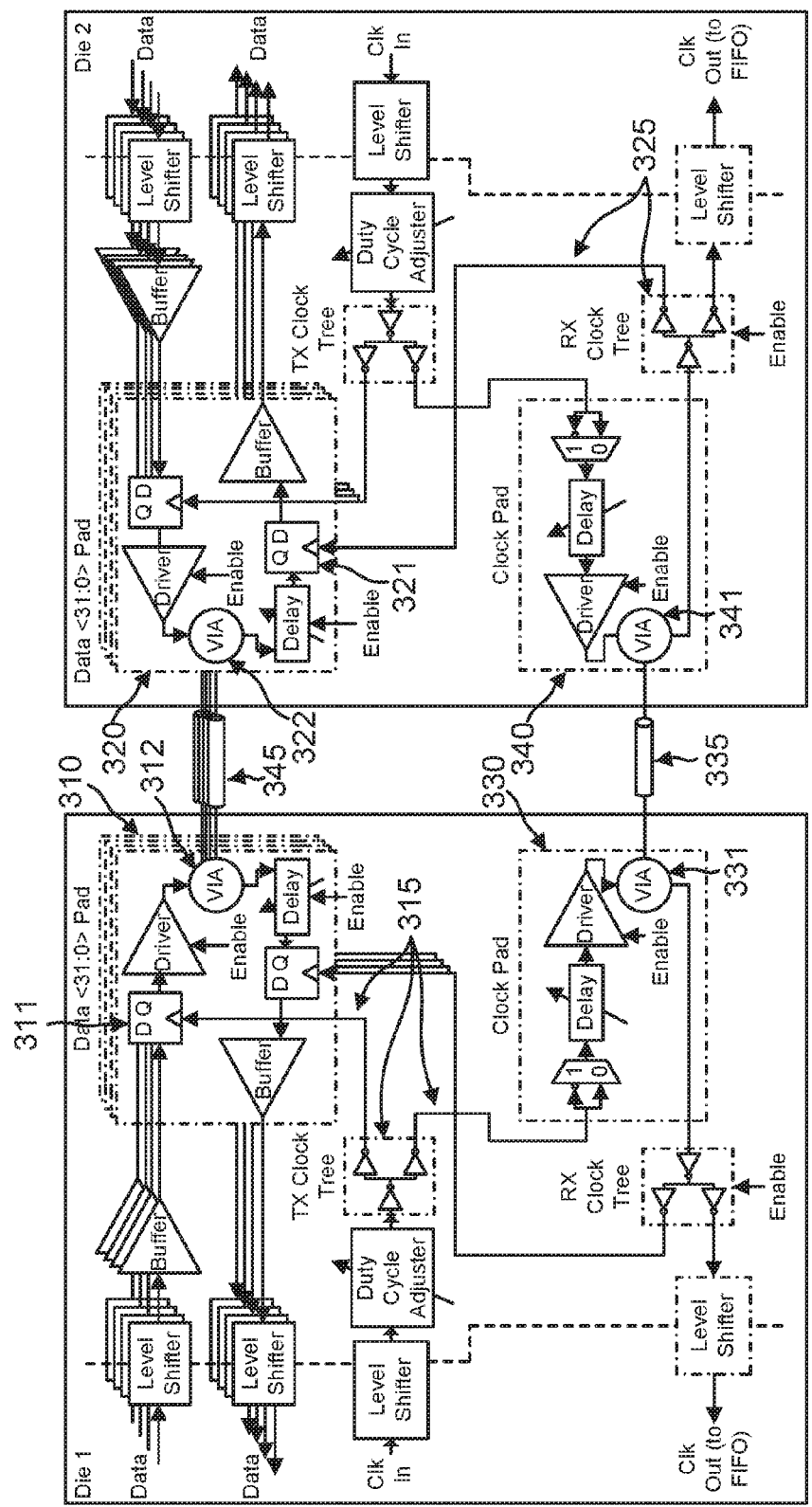
FIG. 3 shows a functional view of an example die-to-die interface, according to one embodiment of the present disclosure.

FIG. 3 shows a functional view of an example die-to-die interface, according to one embodiment of the present disclosure. FIG. 3 includes die 1 and die 2, which may be same as, or similar to, the dies of FIGS. 1 and 2.

Die 1 includes data pads 310 and clock pad 330. In this example, data pads 310 includes thirty-two data pads (<31: 0>) and may be arranged, e.g., in a four-by-eight grid of nodes. Each of the thirty-two data pads may be associated with a bit of data. The data pads 310 and the clock pad 330 of FIG. 3 are another way of illustrating the bits and nodes of a die in the examples of FIGS. 1 and 2.

Clock pad 330 is used to forward the clock from die 1 to die 2. In this example, the clock reaches via 331, which is externally exposed at die 1 and propagates over clock route 335 to via 341 at clock pad 340. Clock pads 330 and 340 are analogous to nodes 211 and 221 of FIG. 2.

Die 1 includes transmit clock tree 315, which is shown conceptually in FIG. 3. Transmit clock tree 315 includes buffers to receive the clock (from Clk in) metal routes to data pads 310, and a metal route to clock pad 330. While no specific topological arrangement of the transmit clock tree 315 is shown in FIG. 3, it is understood that tree 315 would have an architecture according to the principles described above with respect to FIGS. 1 and 2. In other words, transmit clock tree 315 in this example would be unbalanced, having non-uniform insertion delays that match insertion delays at receive clock tree 325. In the example of die 1 of FIG. 3, the insertion delay for a given bit is the propagation delay of the clock signal through clock tree 315 from start of the tree to its respective flip-flop 311 input.

Similarly, receive clock tree 325 includes buffers to receive the clock from clock pad 340 and metal routes to distribute the clock to data pads 320. In the example of die 2 of FIG. 3, the insertion delay for a given bit is the propagation delay of the clock signal through clock tree 325 from start of the tree to its respective flip-flop 321 input. The metal routes to the data pads 320 provide non-uniform insertion delays that, where corresponding pairs of nodes (one a transmit node and one a receive node) have matching insertion delays. Data pads 320 include thirty-two nodes in this example, where each of the nodes corresponds to one of the nodes of data pads 310. Consistent with the examples of FIGS. 1 and 2, data nodes 310 and 320 are arranged in a spatial pattern such that a pair of corresponding nodes (one a transmit node and one a receive node) are similarly placed upon their respective die. Thus, each of the thirty-two data forwarding routes 345 are uniform in length (and match a length of clock forwarding route 335).

Returning to die 1, the clock is distributed by transmit clock tree 315 to the thirty-two data pads 310. Each data pad 310 in this example includes a flip-flop 311, which is storing data. When a given flip-flop 311 receives the clock edge it forwards the data to its respective via 312. The data is then transported on a respective data forwarding route 345 to its corresponding node within data pads 320. The data is received by a respective via 322 and is captured by its respective flip-flop 321 at the clock edge. This process is the same as that described above with respect to FIGS. 1 and 2, where, e.g., node 216 sends data to node 226.

The examples of FIGS. 1-3 above are provided for illustrative purposes, and it is understood that the scope of embodiments is not limited to the specific embodiments shown above. For instance, clock trees may be adapted to serve any appropriate number of nodes (whether thirty-two, fifty, or another number). Also, the flip-flops at the nodes may operate on either a rising or falling clock edge, as appropriate. Furthermore, while FIG. 3 shows flip flops, any appropriate sequential logic circuit may be used in various embodiments.

Figure 4:
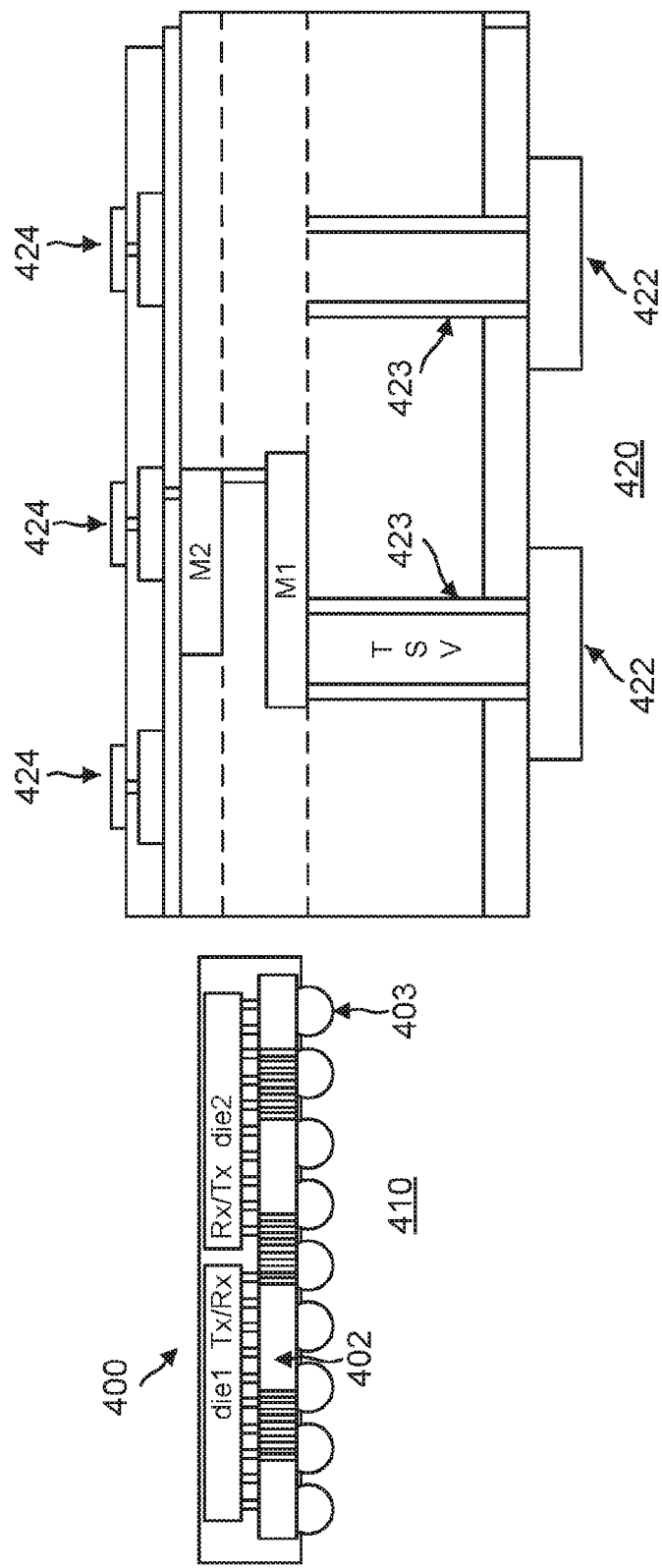
FIG. 4 shows one example multi-die package adapted according to one embodiment.

The die of FIGS. 1-3 may be included in a multi-die package. FIG. 4 shows one example multi-die package adapted according to one embodiment, which may accommodate dies.

FIG. 4 includes two views 410 and 420. View 410 is a side view of package 400, which includes die 1 and die 2. View 420 is a cut-away view of a portion of interposer 402 that serves die 1.

Focusing on view 410, die 1 and die 2 are in communication with each other by data and clock forwarding routes (not shown) as explained in more detail above. Die 1 and 2 are also in communication with solder balls on an external surface of package 400. One example solder ball 403 is marked in view 410, and view 410 shows nine solder balls in this side view. Die 1, die 2, and interposer 402 are encapsulated in package 400 according to any appropriate packaging technique now known or later developed. The scope of embodiments is not limited to any particular packaging technique.

View 420 shows a cross section of a portion of interposer 402. Solder balls 422 correspond to two of the solder balls shown in view 410 (e.g., solder ball 403). Balls 422 are in communication with metal layers M1 and M2 by through silicon vias (TSVs) 423. Structures 424 are in communication with metal layers M1 and M2 as well as with data and/or clock pads of the die 1 and 2. Thus, the interposer 402 provides for communication between the die and the solder balls and for communication between the die themselves. For example, the metal layer M1 may be used to provide communication between the die, where communication between the die includes the data forwarding routes and the clock forwarding routes of FIG. 3.

Figure 5:
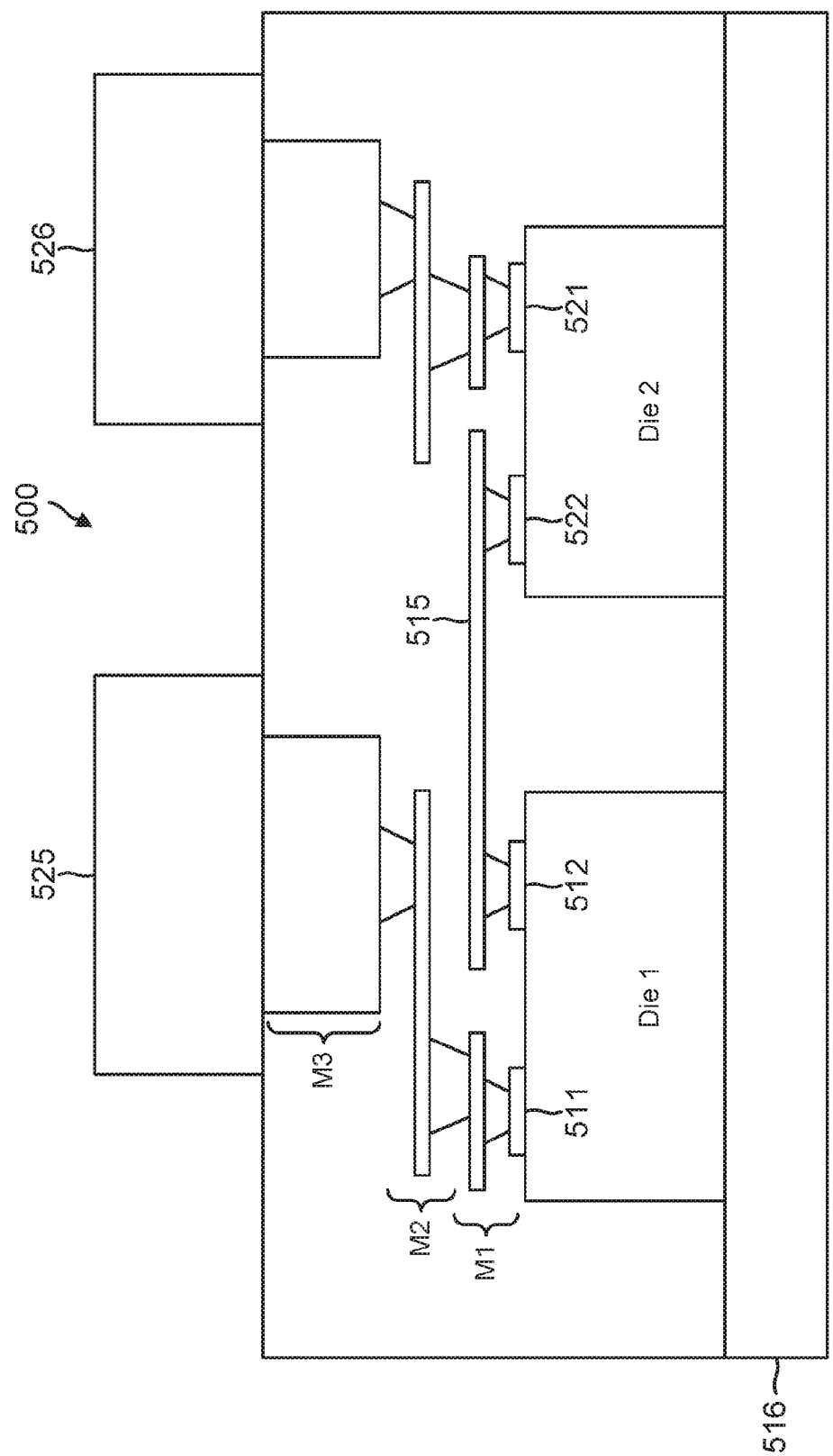
FIG. 5 is an illustration another example multi-die package, adapted according to one embodiment.

FIG. 5 is an illustration another example multi-die wafer-level package 500, adapted according to one embodiment. In the example of FIG. 5, die 1 and die 2 are disposed upon semiconductor substrate 516, and the package is grown upon die 1, die 2, and substrate 516 using appropriate semiconductor manufacturing processes. For instance, layers of dielectric are grown, then partially etched away to accommodate deposition of metal layers. Metal layers M1, M2, and M3 are shown in FIG. 5, and it is understood that metal layers M1, M2, and M3 are built upon layers of dielectric. After the dielectric layers and metal layers are formed, solder balls 525 and 526 are formed on the exterior surface of the package. The package thus includes die 1, die 2, multiple dielectric and metal layers, and external solder balls.

Package 500 differs from package 400 (FIG. 4) in that the package is "grown" upon die 1 and 2 using semiconductor manufacturing processes (e.g., deposition, etching, sputtering, etc.) rather than being assembled from multiple separate parts that are encapsulated together using traditional packaging techniques (e.g., adhesives and the like).

In this example, die 1 includes pads 511, 512, and die 2 includes pads 521, 522. Data pads 512 and 522 are data pads (e.g., like individual ones of the pads 310 and 320 of FIG. 3) that share data using metal data route 515. Pads 511 and 521 are in communication with solder balls 525 and 526, respectively, through metal layers M1-M3. Clock trees are not shown explicitly in the embodiment of FIG. 5, but it is understood that the clock trees can be formed in any of the on-chip interconnect metal layers (not shown) within die 1 and die 2.

FIG. 5 is for example only, and it is understood that other embodiments may include many more metal layers and many more solder balls in a particular package. Also, packages may include more than two die.

Various embodiments may provide one or more advantages for package designs. For instance, when it is known beforehand which die are to be placed in a package, clock trees such as those of FIGS. 1 and 2 may be implemented to distribute clocks to the nodes of the die. This is because the die can be designed together with a layout that allows matched insertion delays for corresponding nodes of the two die. The package can further be designed to place the die in proximity to each other to allow for short and uniform data forwarding routes between corresponding nodes.

FIG. 6 is an illustration of an example die-to-die interface, adapted according to one embodiment. Specifically, FIG. 6 shows an example data routing pattern that may be used with any of the embodiments described above. Die 1 and die 2 each include a three-by-three array of nodes spatially placed so that similarly positioned nodes on each die correspond to each other. For example, node 601a corresponds to node 602a, node 601b corresponds to node 602b, and node 601c corresponds to node 602c. The other six nodes on each die correspond similarly.

Nodes 601a and 602a are in communication through data route 603a, nodes 601b and 602b are in communication through data route 603b, and nodes 601c and 602c are in communication through data route 603c. The other six corresponding pairs are also in communication similarly. Of note is that each of the data routes 603a-c, and the other unlabeled data routes, are uniform in length. Thus, each corresponding pair of nodes has substantially the same delay in communicating information from die 1 to die 2. Although not shown in FIG. 6, it is understood that a clock route may also be used that is substantially the same length as the data routes. The scope of embodiments is not limited to any particular number of nodes on a die or number of corresponding pairs, as the three-by-three array of FIG. 6 is an example.

Another embodiment includes a debug setup in which both the TX clock tree and the RX clock tree are on the same die (not shown). Traces connect the TX and RX nodes as if they were on different die. Such a test embodiment may be used to debug potential issues with the wafer-level package processing.

Example methods of use for the circuits of FIGS. 1-6 will now be discussed.

Example Methods of Use

Figure 7:
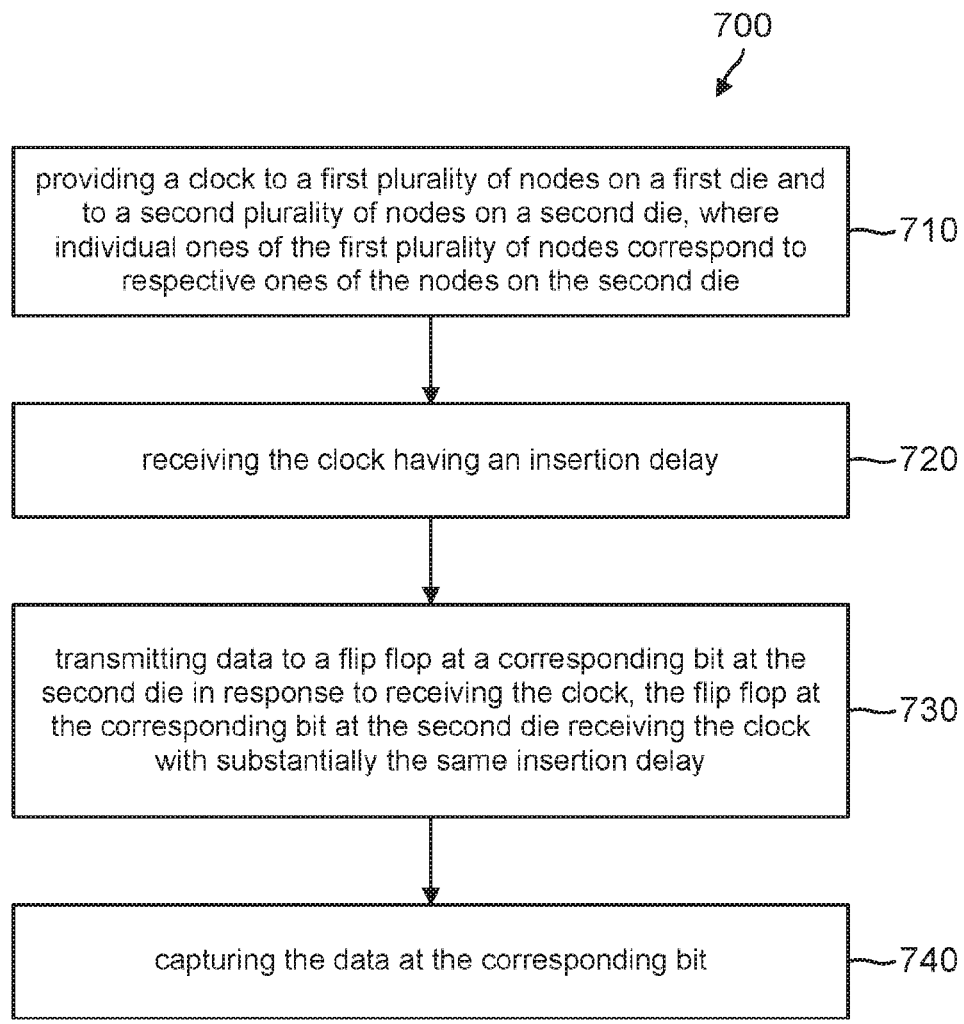
FIG. 7 is a flow diagram for an example method of distributing clock signals at a die-to-die interface, according to one embodiment.

FIG. 7 is a flow diagram for an example method 700 of distributing clock signals at a die-to-die interface, according to one embodiment. The method 700 may be performed by the die shown in FIGS. 1-6. In the example method 700, the actions are performed with respect to clock trees such that those shown in FIGS. 1 and 2, where insertion delays are non-uniform, but the nodes of a corresponding transmit/receive pair have matching insertion delays. Also each pair of nodes handles a bit of data so that each node has a flip-flop that either transmits data to the other node or captures data sent from the other node.

Thus, consistent with FIGS. 1 and 2, a corresponding pair of nodes includes a transmit flip-flop and a receive flip-flop that handle the same bit of data from die-to-die. Both the transmit node and the receive node are positioned spatially within their respective clock trees substantially the same.

The method begins in a block 710, which includes providing a clock to a first plurality of nodes on a first die and to a second plurality of nodes on a second die, where individual ones of the first plurality of nodes correspond to respective ones of the nodes on the second die.

In the examples of FIGS. 1 and 2, the clock is received at the transmit (first) clock tree and then is forwarded to the receive (second) clock tree over a clock forwarding route. Thus, the clock at the receive clock tree arrives after a short delay that is additive to any insertion delay at the receive tree itself.

Blocks 720 and 730 describe action at individual ones of the first plurality of bits. Thus, the actions of blocks 720 and 730 are performed individually at each of the nodes of the first plurality of nodes.

At block 720, a node receives the clock having an insertion delay. In this example, the insertion delay for a given bit is the propagation delay of the clock signal through its clock tree from start of the clock tree to end of the tree, where the end of the tree is a flip-flop input for the bit. As explained above, the clock insertion delay is non-uniform and may be different for different nodes on the same clock tree. In this example, receiving the clock may include receiving a rising edge or a falling edge of the clock at a sequential logic circuit, such as a flip-flop. At the transmit clock tree, the flip-flop may store data to be transmitted at the received clock edge.

At block 730, in response to receiving the clock the node transmits data to a flip-flop at a corresponding bit at the second die. The flip-flop at the corresponding bit at the second die receives the clock with substantially the same insertion delay. The flip-flop at the corresponding bit of the second die does not receive the clock at the same time as the bit of the first die because there is some delay attributable to transferring the clock from the first die to the second die. Rather, the two corresponding bits experience substantially the same clock tree-dependent propagation delay independent of any die-to-die clock transfer delay.

The flip-flop at the corresponding receive bit captures the data at block 740. For instance, the flip-flop at the corresponding receive bit may act on the rising or falling edge of the clock to capture the data.

In the example above, each of the pairs of nodes (transferring a bit of data) experiences an insertion delay that is different from the insertion delays experienced by at least one other pair of nodes. Therefore, the pairs of nodes may not transfer data at the same time, instead, transferring data at a time defined by respective insertion delays for a given pair.

In an example wherein a rising lock edge is the clock edge of interest, the insertion delay for a given bit on the transmit side is the delay from the time the clock rises at the "start" node of the transmit clock tree to the time the clock rises at the flip flop of the transmit bit. At the receive side, the insertion delay for a given bit is the delay from the time the clock rises at the "start" node of the receive clock tree to the time the clock rises at the flip flop of the receive bit. Other embodiments may use a falling edge of the clock in the same way.

The scope of embodiments is not limited to the specific method shown in FIG. 7. Other embodiments may add, omit, rearrange, or modify one or more actions. For instance, in many real-world applications, the actions of blocks 710-740 are performed continuously as the dies transfer digital bits of information therebetween, perhaps millions or billions of times a second.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
    a transmit clock tree configured to receive a clock signal and to feed the clock signal to a first plurality of nodes; and
    a receive clock tree feeding a second plurality of nodes, wherein the transmit clock tree is configured to forward the clock signal to the receive clock tree;
    wherein individual nodes on the transmit clock tree correspond to respective individual nodes on the receive clock tree, each clock tree being unbalanced and providing matched insertion delays for corresponding nodes at the transmit and receive clock trees.

2. The circuit of claim 1, wherein the corresponding nodes are connected across two dies by data routes, wherein the data routes are of a uniform length.

3. The circuit of claim 1, wherein the first plurality of nodes and the second plurality of nodes are configured to receive the same clock signal.

4. The circuit of claim 1, wherein the transmit clock tree is configured to provide the clock signal to the individual nodes of the first plurality of nodes with different insertion delays relative to each other, wherein an insertion delay for a given node of the first plurality of nodes includes a propagation delay from a time the clock signal rises at a start node of the transmit clock tree to a time the clock rises at a flip flop of the given node.

5. The circuit of claim 1, wherein the receive clock tree is configured to provide the clock signal to the individual nodes of the second plurality of nodes with different insertion delays relative to each other, wherein an insertion delay for a given node bit of the second plurality of nodes includes a propagation delay from a time the clock signal rises at a start node of the receive clock tree to a time the clock signal rises at a flip flop of the given node.

6. The circuit of claim 1, wherein the transmit clock tree has non-uniform route lengths from a start node of the transmit clock tree to each of the first plurality of nodes, and wherein the receive clock tree has non-uniform route lengths from a start node of the receive clock tree to each of the second plurality of nodes.

7. The circuit of claim 1, wherein each node of the first plurality of nodes includes a flip-flop, further wherein each node of the second plurality of nodes includes a flip-flop.

8. The circuit of claim 1, wherein the transmit clock tree is included in a first die and wherein the receive clock tree is included in a second die, further wherein the first die and second die are disposed in a multi-die package, the package comprising:
    a substrate upon which the first and second die are disposed;
    a plurality of metal layers providing electrical communication between the first die and second die and with external pins of the package; and
    dielectric layers over the first die and second die.

9. The circuit of claim 1, wherein the transmit clock tree is included in a first die and wherein the receive clock tree is included in a second die, further wherein the first die and second die are in electrical communication with each other through an interposer, further wherein the first die and second die and the interposer are included in a multi-die package.

10. A method comprising:
    providing a clock to a first plurality of nodes on a first die and to a second plurality of nodes on a second die, where individual ones of the first plurality of nodes correspond to respective ones of the nodes on the second die; and
    for each one of the first plurality of nodes:
        receiving the clock having an insertion delay; and
        transmitting data to a flip-flop at a corresponding node at the second die in response to receiving the clock, the flip-flop at the corresponding node at the second die receiving the clock with substantially the same insertion delay;
    wherein a clock tree of the first die, providing the clock to the first plurality of nodes, has non-uniform insertion delays of the clock; and wherein a clock tree of the second die, providing the clock to the second plurality of nodes, has non-uniform insertion delays of the clock.

11. The method of claim 10, wherein a plurality of pairs of the corresponding nodes are connected from the first die to the second die using metal routes that have a uniform length.

12. The method of claim 11, further comprising:
transmitting the clock from a clock node on the clock tree of the first die to a clock node on the clock tree of the second die, wherein a metal route between the clock node on the clock tree of the first die to the clock node on the clock tree of the second die has the uniform length.

13. The method of claim 10, further comprising for each one of the second plurality of nodes:
capturing the data by the flip-flop at the corresponding node at the second die in response to receiving the clock.

14. The method of claim 10, wherein the individual nodes of the first plurality of nodes have different insertion delays relative to each other.

15. The method of claim 10, wherein the individual nodes of the second plurality of nodes have different insertion delays relative to each other.

16. The method of claim 10, wherein the first die and the second die are in communication with each other through an interposer.

17. The method of claim 10, wherein the first die and the second die are included in a same multi-die package.

* * * * *